(12) United States Patent
Shimozono

(10) Patent No.: US 10,418,971 B2
(45) Date of Patent: Sep. 17, 2019

(54) ACOUSTIC WAVE MODULE

(71) Applicant: KYOCERA Corporation, Kyoto-shi, Kyoto (JP)

(72) Inventor: Masahisa Shimozono, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 129 days.

(21) Appl. No.: 15/559,697

(22) PCT Filed: Mar. 30, 2016

(86) PCT No.: PCT/JP2016/060342
§ 371 (c)(1),
(2) Date: Sep. 19, 2017

(87) PCT Pub. No.: WO2016/159053
PCT Pub. Date: Oct. 6, 2016

(65) Prior Publication Data
US 2018/0254766 A1      Sep. 6, 2018

(30) Foreign Application Priority Data

Mar. 31, 2015 (JP) .................................. 2015-071922

(51) Int. Cl.
*H03H 9/72*      (2006.01)
*H01L 41/047*   (2006.01)
(Continued)

(52) U.S. Cl.
CPC ............. *H03H 9/72* (2013.01); *H01L 41/047* (2013.01); *H03H 9/02818* (2013.01);
(Continued)

(58) Field of Classification Search
CPC ............... H03H 9/02992; H03H 9/145; H03H 9/14502; H03H 9/14544; H03H 9/205;
(Continued)

(56) References Cited

U.S. PATENT DOCUMENTS 7,456,705 B2 *  11/2008  Ito .......................... H03H 9/725
                                                              333/133
8,018,298 B2 *   9/2011  Ueda ..................... H03H 9/562
                                                              333/133
(Continued)

FOREIGN PATENT DOCUMENTS

JP     2007-74698 A    3/2007
JP     2009-010932 A   1/2009
(Continued)

OTHER PUBLICATIONS

International Search Report dated Jun. 21, 2016, issued by Japan Patent Office for International Application No. PCT/JP2016/060342.

*Primary Examiner* — Barbara Summons
(74) *Attorney, Agent, or Firm* — Procopio Cory Hargreaves and Savitch LLP

(57) ABSTRACT

A communication module includes a serial resonator of a transmission filter and an auxiliary resonator of a reception filter. Each of the serial resonator and the auxiliary resonator includes a piezoelectric substrate and a positive-side comb-shaped electrode and negative-side comb-shaped electrode meshing with each other. The positive-side comb-shaped electrode in the transmission filter and the negative-side comb-shaped electrode in the reception filter are connected to each other. The orientation from the positive-side comb-shaped electrode to the negative-side comb-shaped electrode relative to the crystal orientation of the piezoelectric substrate in the transmission filter and the orientation from the negative-side comb-shaped electrode to the positive-side comb-shaped electrode relative to the crystal orientation of the piezoelectric substrate in the reception filter are inverse to each other.

7 Claims, 10 Drawing Sheets

(51) Int. Cl.
*H03H 9/02* (2006.01)
*H03H 9/145* (2006.01)
*H03H 9/205* (2006.01)
*H03H 9/25* (2006.01)
*H03H 9/60* (2006.01)
*H03H 9/64* (2006.01)

(52) U.S. Cl.
CPC .... *H03H 9/02992* (2013.01); *H03H 9/14502* (2013.01); *H03H 9/14544* (2013.01); *H03H 9/205* (2013.01); *H03H 9/25* (2013.01); *H03H 9/605* (2013.01); *H03H 9/6433* (2013.01); *H03H 9/6483* (2013.01); *H03H 9/725* (2013.01)

(58) Field of Classification Search
CPC ........ H03H 9/25; H03H 9/605; H03H 9/6423; H03H 9/6433; H03H 9/72; H03H 9/02543; H03H 9/02559; H03H 9/02818; H03H 9/64; H03H 9/6489; H03H 9/725; H01L 41/047

USPC .......................................... 333/133, 193–196
See application file for complete search history.

(56) References Cited

U.S. PATENT DOCUMENTS

| | | | | |
|---|---|---|---|---|
| 9,843,305 | B2* | 12/2017 | Nakagawa | H03H 9/02755 |
| 9,847,770 | B2* | 12/2017 | Nakagawa | H03H 9/6469 |
| 2007/0030096 | A1 | 2/2007 | Nishihara et al. | |
| 2008/0252398 | A1 | 10/2008 | Jamneala et al. | |
| 2012/0112853 | A1 | 5/2012 | Hikino et al. | |
| 2015/0097638 | A1* | 4/2015 | Yu | H03H 9/605 333/189 |
| 2016/0049920 | A1* | 2/2016 | Kishino | H03H 9/0033 343/858 |
| 2016/0118956 | A1 | 4/2016 | Kihara et al. | |

FOREIGN PATENT DOCUMENTS

| | | |
|---|---|---|
| JP | 2012-100180 A | 5/2012 |
| JP | WO2014/133084 A1 * | 9/2014 |
| WO | 2015/002047 A1 | 1/2015 |

* cited by examiner

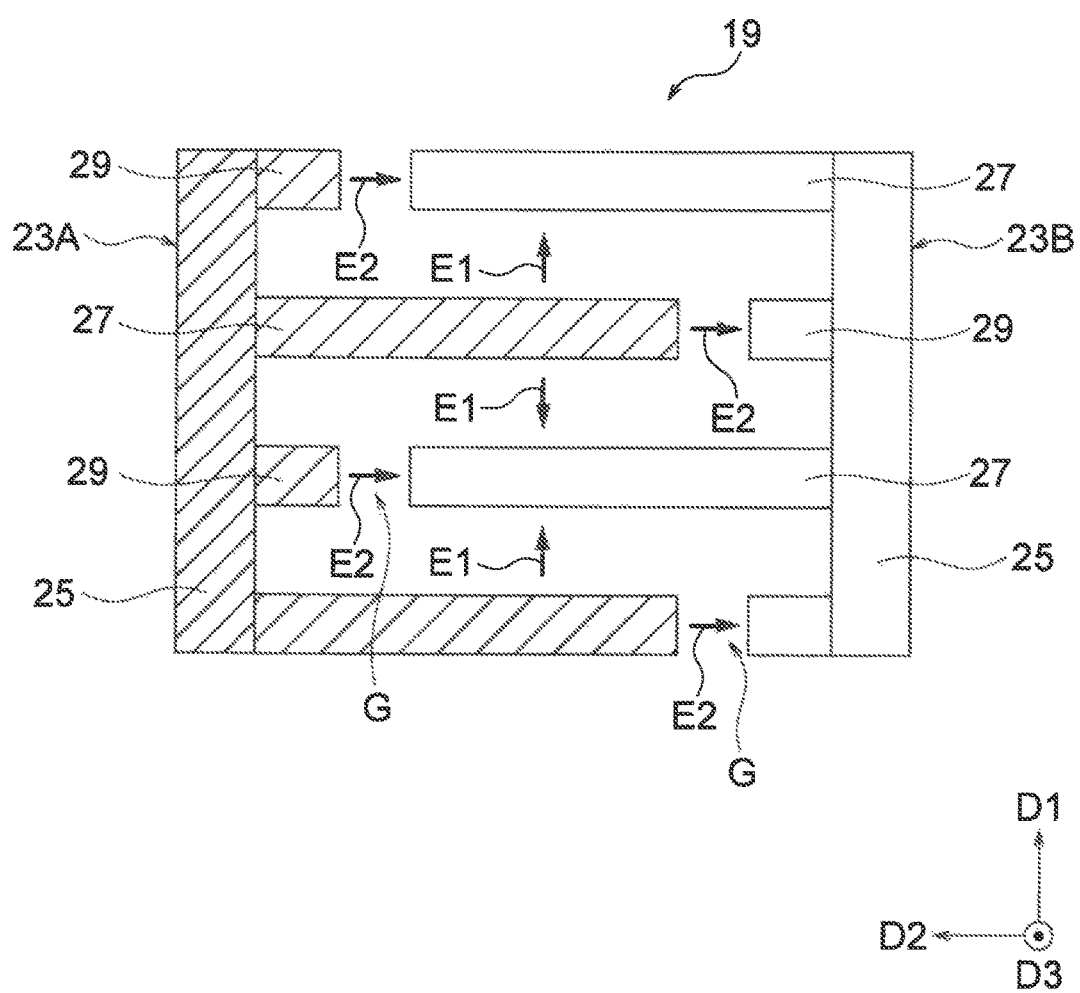

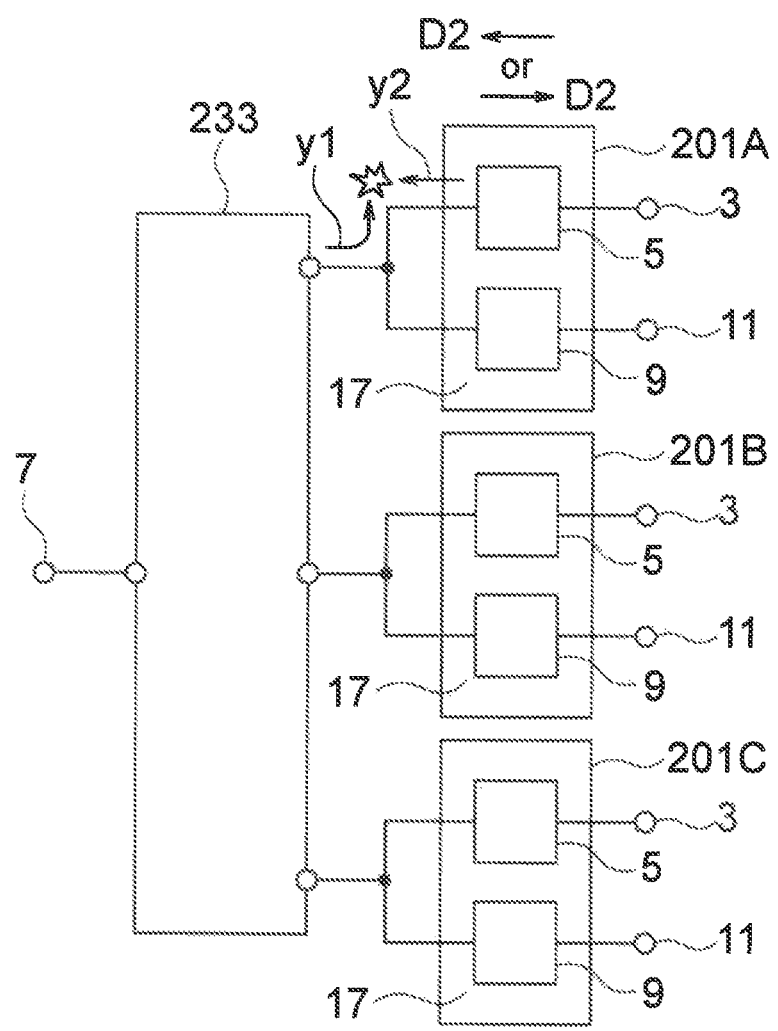

ACOUSTIC WAVE MODULE

TECHNICAL FIELD

The present invention relates to an acoustic wave module utilizing a surface acoustic wave (SAW) or another acoustic wave.

BACKGROUND ART

Known in the art is an acoustic wave element having a piezoelectric substrate and an IDT (interdigital transducer) electrode provided on the major surface of the piezoelectric substrate (for example, see Japanese Patent Publication No. 2007-074698A). The IDT electrode has a pair of comb-shaped electrodes. Each comb-shaped electrode has a plurality of electrode fingers which extend parallel to each other. The pair of comb-shaped electrodes are provided so that their electrode fingers are alternately arranged in the propagation direction of the acoustic wave. That is, the pair of comb-shaped electrodes are provided so as to intermesh with each other.

In such an acoustic wave element, a distortion signal is generated due to nonlinearity of the piezoelectric characteristics. Japanese Patent Publication No. 2007-074698A discloses a configuration dividing the electrostatic capacity of the acoustic wave element without changing it. By employing such a configuration, it is proposed to divide a voltage which is applied to the acoustic wave element to thereby reduce a distortion wave.

SUMMARY OF INVENTION

An acoustic wave module according to one aspect of the present invention includes a first acoustic wave element and a second acoustic wave element which is electrically connected to the first acoustic wave element. The first acoustic wave element includes a first piezoelectric substrate formed by a single crystal and a first comb-shaped electrode and a second comb-shaped electrode which are located on the first piezoelectric substrate and intermesh with each other. The second acoustic wave element includes a second piezoelectric substrate which is formed by a single crystal of the same material as that for the first piezoelectric substrate, but is separate from the first piezoelectric substrate and a third comb-shaped electrode and a fourth comb-shaped electrode which are located on the second piezoelectric substrate and intermesh with each other. Further, the first comb-shaped electrode and the third comb-shaped electrode are electrically connected. The direction from the first comb-shaped electrode to the second comb-shaped electrode relative to the direction obtained by projecting the Z-axis of the crystal of the first piezoelectric substrate onto its surface and the direction from the third comb-shaped electrode to the fourth comb-shaped electrode relative to the direction obtained by projecting the Z-axis of the crystal of the second piezoelectric substrate onto its surface are in opposite directions.

An acoustic wave module according to another aspect of the present invention includes an acoustic wave element and an electronic component which is electrically connected to the acoustic wave element. The acoustic wave element includes a first piezoelectric substrate formed by a single crystal and a first comb-shaped electrode and a second comb-shaped electrode which are located on the first piezoelectric substrate and intermesh with each other. Further, an orientation from the first comb-shaped electrode to the second comb-shaped electrode relative to a crystal orientation of the piezoelectric substrate is an orientation by which a phase of an even order distortion signal traveling from the acoustic wave element toward the electronic component and a phase of an even order distortion signal traveling from the electronic component toward the acoustic wave element deviate from each other with a difference of 90° to 270°.

According to the above configurations, distortion signals can be suitably reduced.

BRIEF DESCRIPTION OF DRAWINGS

FIG. 4 is an enlarged diagram of a region IV in FIG. 3.

FIG. 8 is a schematic view showing the configuration of a principal part of a multiplex module according to a fifth embodiment.

DESCRIPTION OF EMBODIMENTS

Below, a SAW device according to an embodiment of the present invention will be explained with reference to the drawings. Note that, the drawings used in the following explanation are schematic ones, and dimensions, ratios etc. on the drawings do not always match with actual ones.

In the second and following embodiments, in configurations the same as or similar to those in the already explained embodiments, use will be made of the same notations as those attached to the configurations of the already explained embodiments. Further, sometimes illustrations and explanations will be omitted. Further, in the second and following embodiments, in a case where notations different from those attached to the configurations of the already explained embodiments are attached to the configurations corresponding (similar) to the configurations of the already explained embodiments, the matters which are not particularly noted are the same as the configurations of the already explained embodiments.

<First Embodiment>

(Fundamental Configuration)

Figure 1:
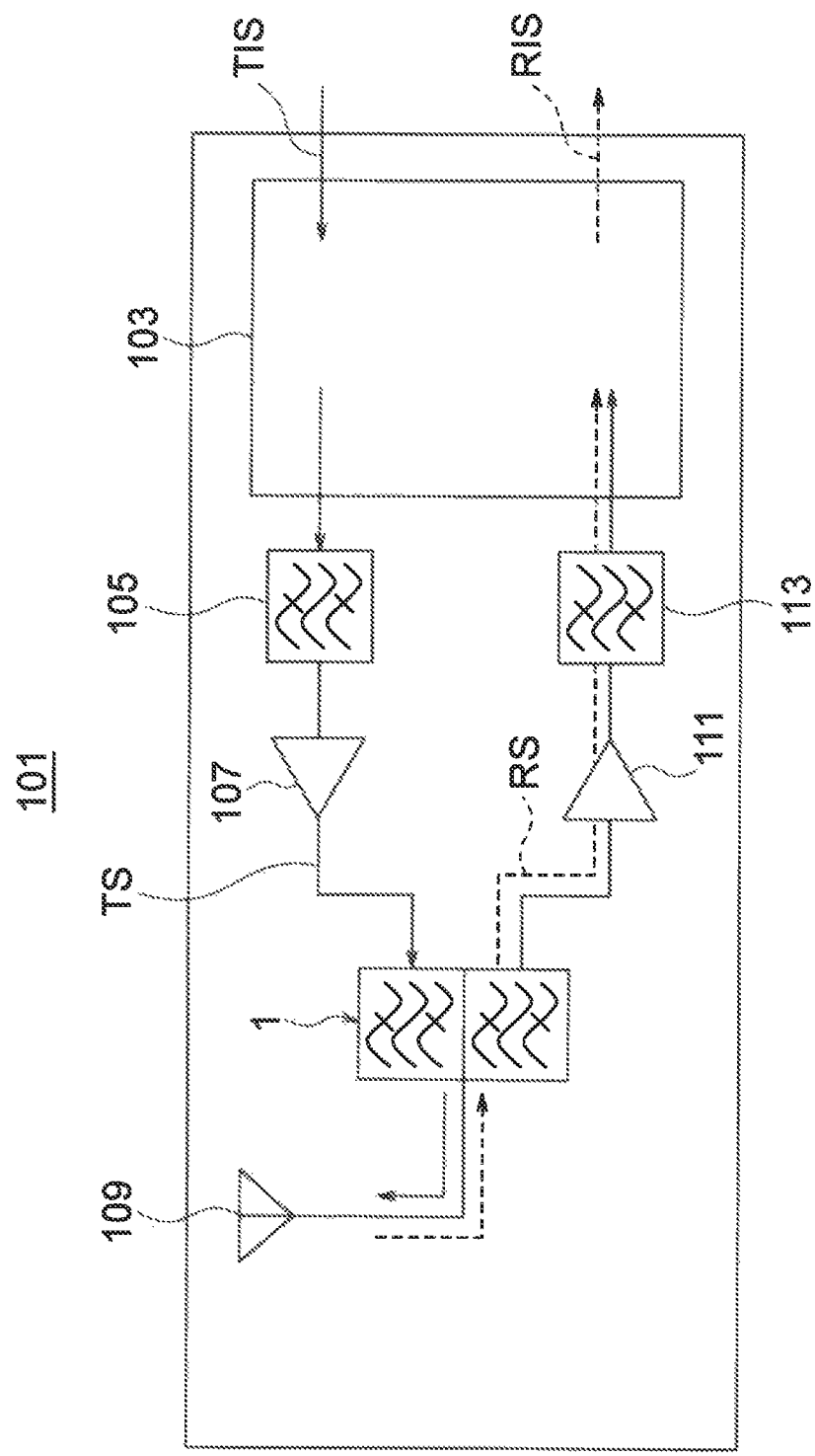
FIG. 1 is a block diagram showing a principal part of a communication module according to a first embodiment.

FIG. 1 is a block diagram showing a principal part of a communication module 101 according to a first embodiment. The communication module 101 performs wireless communication utilizing radio waves. The communication module 101 has a multiplexer 1 for branching a signal in transmission frequency and a signal in reception frequency.

In the communication module 101, a TIS (transmission information signal) containing information to be transmitted is modulated and boosted up in frequency (conversion to a high frequency signal in a carrier frequency) by an RF-IC (radio frequency integrated circuit) 103 to become a TS (transmission signal). The TS is stripped of unnecessary components out of the transmission-use passband by a band pass filter 105, amplified by an amplifier 107, and input to the multiplexer 1. Further, the multiplexer 1 strips the unnecessary components out of the transmission-use passband from the input TS and outputs the result to an antenna 109. The antenna 109 converts the input electrical signal (TS) to a wireless signal (radio wave) and transmits the same.

Further, in the communication module 101, the wireless signal (radio wave) received by the antenna 109 is converted to an electrical signal (RS: reception signal) by the antenna 109 and is input to the multiplexer 1. The multiplexer 1 strips the unnecessary components out of a reception-use passband from the input RS and outputs the result to an amplifier 111. The output RS is amplified by the amplifier 111 and is stripped of unnecessary components out of the reception-use passband by a band pass filter 113. Further, the RS is boosted down in frequency and is demodulated by the RF-IC 103 to become the RIS (reception information signal).

Note that, the TIS and RIS may be low frequency signals (baseband signals) containing suitable information and are for example analog audio signals or digital audio signals. The passband of the wireless signal may be one according to the UMTS (Universal Mobile Telecommunications System) or other various standards. The passband for transmission and the passband for reception usually do not overlap each other. The modulation scheme may be phase modulation, amplitude modulation, frequency modulation, or a combination of any two or more among them. As the circuit system, a direct conversion system was exemplified in FIG. 1. However, it may be a suitable one other than this. For example, it may be a double super-heterodyne system as well. Further, FIG. 1 schematically shows only the principal part. In this, a low pass filter or isolator etc. may be added to a suitable position. Further, the position of the amplifier or the like may be changed as well.

Figure 2:
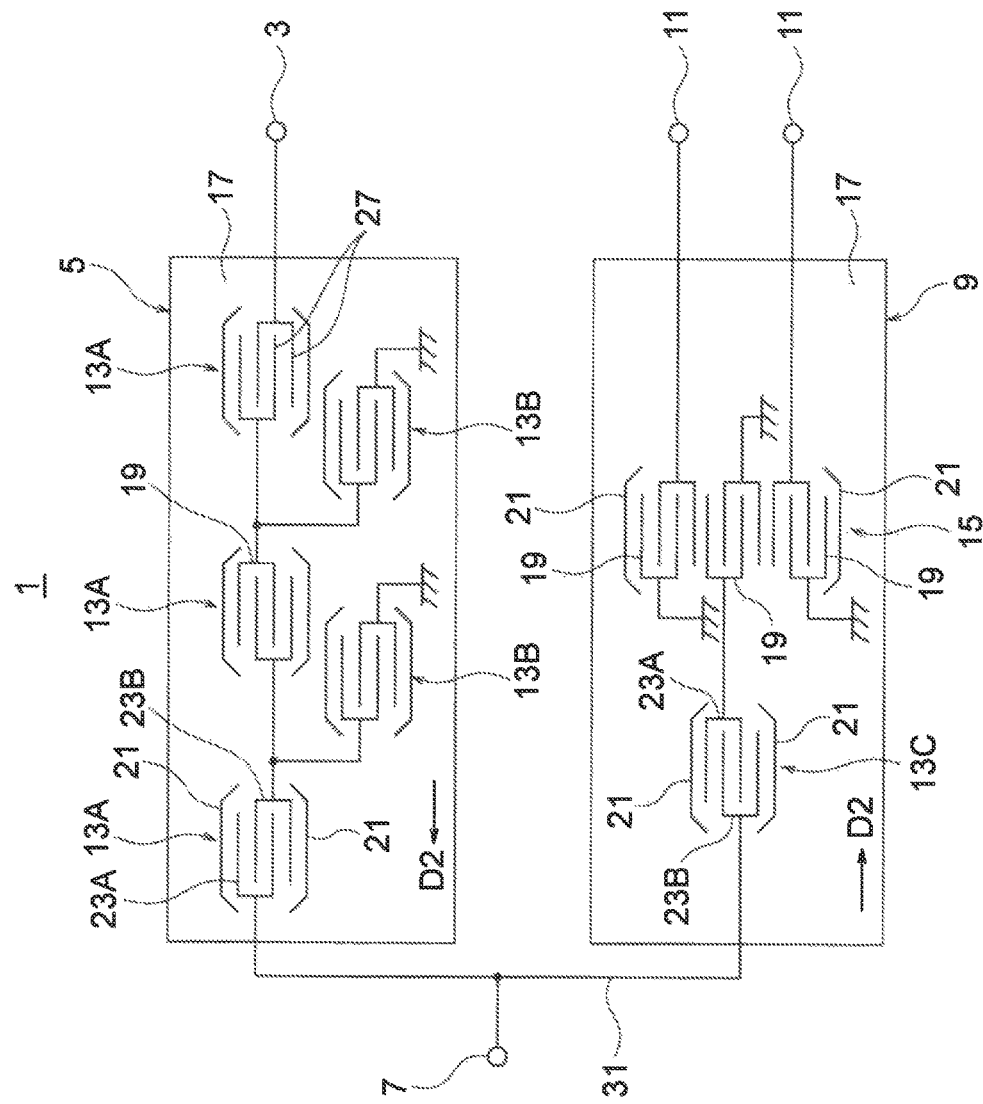
FIG. 2 is a circuit diagram showing the configuration of a multiplexer in the communication module in FIG. 1.

FIG. 2 is a circuit diagram showing the configuration of the multiplexer 1.

The multiplexer 1 has a transmission terminal 3 receiving as input the TS from the amplifier 107, a transmission filter 5 which strips the unnecessary components out of the transmission-use passband from the TS and outputs the result, and an antenna terminal 7 receiving as input the signal from the transmission filter 5. The antenna terminal 7 is connected to the antenna 109.

Further, the multiplexer 1 has a reception filter 9 which strips the unnecessary components out of the reception-use passband from the RS input through the antenna terminal 7 from the antenna 109 and outputs the result and reception terminals 11 receiving as input the signals from the reception filter 9. The reception terminals 11 are connected to the amplifier 111.

Note that, the multiplexer 1, other than the above, may have an impedance matching circuit or the like which is inserted between the transmission filter 5 and reception filter 9 and the antenna terminal 7 as well.

As understood from the above description, the transmission filter 5 and the reception filter 9 are connected in parallel to each other relative to the antenna terminal 7. From another viewpoint, the transmission filter 5 and the reception filter 9 are connected to each other by antenna side wiring 31 which extends from the antenna terminal 7 and is branched and connected to the transmission filter 5 and reception filter 9.

The transmission filter 5, for example, is configured by a ladder type filter. That is, the transmission filter 5 has one or more (three in the present embodiment) serial resonators 13A which are connected in series between the input side and output side of the transmission filter 5 and one or more (two in the present embodiment) parallel resonators 13B which are provided between that serial line and the reference potential parts. Note that, the individual serial resonators 13A and parallel resonators 13B are not exactly the same, but are individually designed according to their positions of arrangement and the required filter characteristics.

The reception filter 9, for example, has a multiple mode filter 15 and an auxiliary resonator 13C which is connected in series to the input side of the multiple mode filter 15. Note that, in the present embodiment, the multiple mode includes a double mode.

Figure 3:
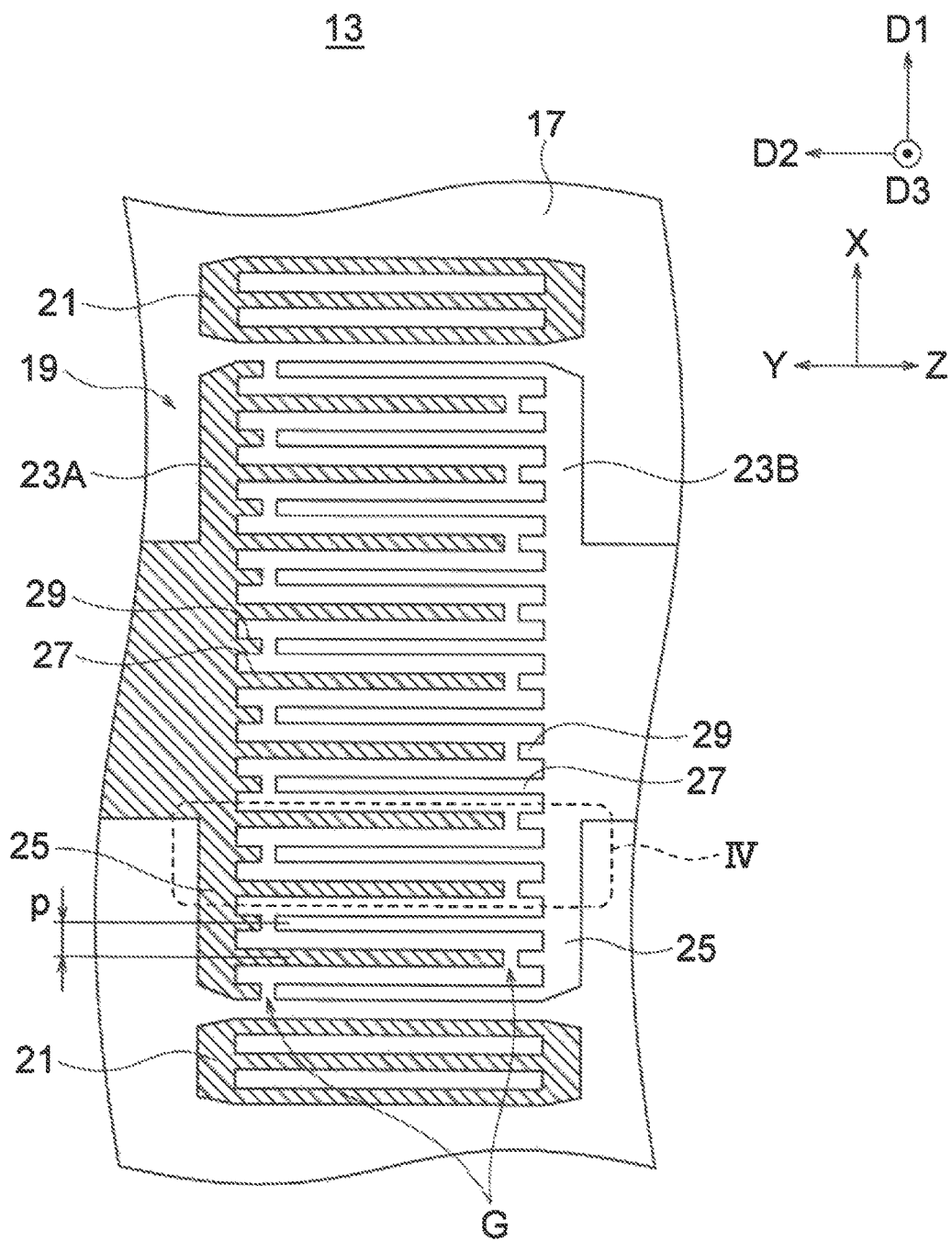
FIG. 3 is a plan view showing the structure of a resonator in the multiplexer in FIG. 2.

FIG. 3 is a plan view showing the configuration of the serial resonator 13A, parallel resonator 13B, and auxiliary resonator 13C (Hereinafter, sometimes they will not be differentiated and will be referred to as the "resonators 13".).

Note that, in the resonators 13, any direction may be defined as the "upper part" or "lower part". However, in the following description, for convenience, an orthogonal coordinate system comprised of a D1-axis, D2-axis, and D3-axis will be defined, and sometimes use will be made of "upper surface" or other terms by defining the positive side of the D3-axis (this side of the drawing sheet in FIG. 3) as the "upper part". Further, in FIG. 3, for making the drawing easier to see, for convenience, hatching is attached to the surfaces of some members.

The resonator 13 is for example configured as a 1-port SAW resonator and has a piezoelectric substrate 17 and an IDT electrode 19 and reflectors 21 which are provided on the upper surface of the piezoelectric substrate 17. Note that, the resonator 13, other than the above members, may have additional films arranged on the upper surfaces of the IDT electrode 19 and reflectors 21; a bonding layer interposed between the IDT electrode 19 and reflectors 21, and the piezoelectric substrate 17; and a protective layer covering the upper surface of the piezoelectric substrate 17 from the tops (or additional films) of the IDT electrode 19 and reflectors 21 as well.

The piezoelectric substrate 17 is the substrate having an upper surface parallel to the D1-axis and D2-axis (perpendicular to the D3-axis). The planar shape and dimensions thereof may be suitably set. Further, the piezoelectric substrate 17 is for example configured by a single crystal having piezoelectricity such as a lithium niobate ($LiNbO_3$) single crystal or a lithium tantalate ($LiTaO_3$) single crystal. The cut angle thereof may be suitably set in accordance with the type of the SAW which is utilized or the like. For example, the piezoelectric substrate 17 is a rotated Y-cut and X-propagating one. That is, the X-axis is parallel to the upper surface of the piezoelectric substrate 17 (D1-axis), and the Y-axis is inclined relative to the normal line of the upper surface of the piezoelectric substrate 17 by a predetermined angle.

Note that, in the explanation of the present embodiment, the relationship between the orthogonal coordinate system comprised of the D1-axis, D2-axis, and D3-axis and the orthogonal coordinate system comprised of the X-axis, Y-axis, and Z-axis (that is, the crystal orientation) is constant. Accordingly, in the following description, sometimes the directions of the crystal orientation of the piezoelectric substrate 17 will be indicated by the D1-axis, D2-axis, and/or D3-axis.

The IDT electrode 19 is configured by conductive patterns (conductive layer) formed on the upper surface of the piezoelectric substrate 17 and has a positive-side comb-shaped electrode 23A and negative-side comb-shaped electrode 23B. Note that, in the following description, sometimes the positive-side comb-shaped electrode 23A and negative-side comb-shaped electrode 23B will be simply referred to as the "comb-shaped electrodes 23" and will not be differentiated. Further, the positive-side comb-shaped electrode 23A designates the comb-shaped electrode 23 which is positioned on the positive side of the D2-axis in the pair of comb-shaped electrodes 23, while the negative-side comb-shaped electrode 23B designates the comb-shaped electrode 23 which is positioned on the negative side of the D2-axis in the pair of comb-shaped electrodes 23 (these names do not designate the positive-side and/or negative-side of the potential.). That is, in this example, in the components obtained by projecting the Z-axis onto the upper surface of the piezoelectric substrate 17, the positive-side comb-shaped electrode 23A designates the comb-shaped electrode 23 positioned on the negative side, and the negative-side comb-shaped electrode 23B designates the comb-shaped electrode 23 positioned on the positive side.

The comb-shaped electrodes 23, for example, have two bus bars 25 which face each other, pluralities of electrode fingers 27 which extend parallel from one bus bar 25 to the other bus bar 25 sides, and pluralities of dummy electrodes 29 which extend from one bus bar 25 to the other bus bar 25 sides between two or more electrode fingers 27. Further, the pair of comb-shaped electrodes 23 are arranged so that the pluralities of electrode fingers 27 intermesh (cross) with each other.

Note that, the propagation direction of the SAW is defined according to the orientations of the pluralities of electrode fingers 27 or the like. However, in the present embodiment, for convenience, sometimes the orientations of the pluralities of electrode fingers 27 etc. will be explained based on the propagation direction of the SAW.

The bus bars 25 are for example substantially formed in long shapes linearly extending in the propagation direction of the SAW (D1-axis direction, X-axis direction) with constant widths. Further, the pair of bus bars 25 face each other in the direction (D2-axis direction) crossing (perpendicularly in the present embodiment) the propagation direction of the SAW. Further, the pair of bus bars 25 are for example parallel to each other, and the distance between the pair of bus bars 25 is constant in the propagation direction of the SAW.

The pluralities of electrode fingers 27 are for example substantially formed in long shapes linearly extending in a direction (D2-axis direction) perpendicular to the propagation direction of the SAW with constant widths and are arranged at schematically constant intervals in the propagation direction of the SAW (D1-axis direction, X-axis direction). The pluralities of electrode fingers 27 of the pair of comb-shaped electrodes 23 are provided so that their pitch "p" (for example, the distance between the centers of the electrode fingers 27) becomes equal to the semi-wavelength of the wavelength $\lambda$ of the SAW at the frequency to be resonated at. The wavelength $\lambda$ is for example 1.5 μm to 6 μm.

The lengths (D2-axis direction) of the pluralities of electrode fingers 27 are for example made equal to each other. Further, the widths (D1-axis direction) of the pluralities of electrode fingers 27 are for example made equal to each other. Note that, these dimensions may be suitably set in accordance with the electrical characteristics demanded from the resonator 13 or the like. For example, the width of an electrode finger 27 is 0.4p to 0.7p relative to the pitch "p" of the pluralities of electrode fingers 27.

The pluralities of dummy electrodes 29 are for example substantially formed in long shapes linearly extending in the direction (D2-axis direction) perpendicular to the propagation direction of the SAW with constant widths, and are arranged at the centers between the pluralities of electrode fingers 27 (arrayed with pitch equal to that of the pluralities of electrode fingers 27). Further, the front end of a dummy electrode 29 in one comb-shaped electrode 23 faces a front end of an electrode finger 27 in the other comb-shaped electrode 23 through a gap G. The width (D1-axis direction) of the dummy electrode 29 is for example equal to the width of the electrode finger 27. The lengths (D2-axis direction) of the pluralities of dummy electrodes 29 are for example equal to each other.

The numbers of the pluralities of gaps G are the same as the numbers of the pluralities of electrode fingers 27. Further, the widths (D1-axis direction) of the pluralities of gaps G are equal to the widths of the pluralities of electrode fingers 27 and the widths of the pluralities of dummy electrodes 29 and are equal to each other among the gaps G. The lengths (D2-axis direction) of the pluralities of gaps G are the same as each other among the gaps G. These lengths may be suitably set in accordance with the electrical characteristics demanded from the resonator 13 or the like. For example, the length of a gap G is $0.1\lambda$ to $0.6\lambda$.

The IDT electrode 29 is for example formed by a metal. As this metal, for example, there can be mentioned Al or an alloy containing Al as its principal ingredient (Al alloy). The Al alloy is for example an Al—Cu alloy. Note that, the IDT electrode 19 may be configured by a plurality of metal layers as well. The thickness of the IDT electrode 19 may be suitably set.

When a voltage is applied to the piezoelectric substrate 17 by the IDT electrode 19, a SAW propagated in the D1-axis direction along the upper surface is induced in the vicinity of the upper surface of the piezoelectric substrate 17. Further, the SAW is reflected by the electrode fingers 27. Further, a standing wave having the pitch "p" of the electrode fingers 27 as the semi-wavelength is formed. The standing wave is converted to an electrical signal having the same frequency as that of the standing wave and is extracted by the electrode fingers 27. In this way, the resonator 13 functions as a resonator or filter.

The reflectors 21 are configured by conductive patterns (conductive layer) formed on the upper surface of the piezoelectric substrate 17 and are formed in lattice shapes when viewed on a plane. That is, the reflectors 21 have pairs of bus bars (notation omitted) which face each other in the direction crossing the propagation direction of the SAW and pluralities of electrode fingers (notation omitted) which extend in a direction (D2-axis direction) perpendicular to the propagation direction of the SAW between these bus bars. The pluralities of electrode fingers in the reflector 21 are arranged with a pitch substantially equal to that of the pluralities of electrode fingers 27 in the IDT electrode 19.

FIG. 2 schematically shows the IDT electrode 19 and reflectors 21. In the serial resonator 13A, one of the pair of comb-shaped electrodes 23 is directly or indirectly connected to the antenna terminal 7, and the other is directly or indirectly connected to the transmission terminal 3. In the parallel resonator 13B, one of the pair of comb-shaped electrodes 23 is directly or indirectly connected to the antenna terminal 7, and the other is directly or indirectly connected to the reference potential part. In the auxiliary resonator 13C, one of the pair of comb-shaped electrodes 23 is directly or indirectly connected to the antenna terminal 7, and the other is indirectly connected to the reception terminals 11.

The multiple mode type filter 15 has a plurality of (three in FIG. 2) IDT electrodes 19 which are arranged in the propagation direction of the SAW and a pair of reflectors 21 arranged on the two sides of the same. The multiple mode type filter 15 for example has a function of converting input unbalanced signals to balanced signals as well and is connected to the pair of reception terminals 11. However, the multiple mode type filter 15 may not have such conversion function, and may be connected to one reception terminal 11. Note that, the unbalanced signal is a signal having a potential difference from the reference potential as the signal level, while the balanced signal is the signal which is comprised of two signals and has a potential difference between the two as the signal level.

<Generation of Distortion Signal>

FIG. 4 is a schematic view for explaining the principle of generation of the distortion signal and specifically an enlarged view of a region IV in FIG. 3.

In a case where an electric field applied to the piezoelectric substrate 17 by the IDT electrode 19 is relatively large or the like, a distortion signal is generated in accordance with the nonlinearity of the piezoelectric property. Specifically, this is as follows.

In FIG. 4, the solid arrows parallel to the D1-axis direction and solid arrows parallel to the D2-axis direction indicate electric fields E1 in the D1-axis direction and electric fields E2 in the D2-axis direction at a certain point in time. In this example, an electrical signal is input to the IDT electrode 19, and the potential of the positive-side comb-shaped electrode 23A becomes higher than the potential of the negative-side comb-shaped electrode 23B. Therefore, the electric fields E1 and E2 are formed from the positive-side comb-shaped electrode 23A to the negative-side comb-shaped electrode 23B.

The electrode fingers 27 in the pair of comb-shaped electrodes 23 (electrode fingers 27 having two types of potentials) are alternately arranged at a constant pitch. Therefore, on the two sides in the D1-axis direction of each electrode finger 27, electric fields E1 which are symmetrical about each electrode finger 27 are formed. For this reason, distortion currents I1 caused by the electric fields E1 are cancelled by each other. In more detail, on the two sides of each electrode finger 27, distortion signals I1 having equal magnitudes and the same orientation are generated. Accordingly, when viewed from each electrode finger 27, a distortion signal I1 is output, and a distortion signal I1 having the same strength as that is input. Therefore, the distortion signals I1 are cancelled by each other. Note that, this is not necessarily so at the end parts in the D1-axis direction of the pair of comb-shaped electrodes 23, but the influence thereof is relatively small.

In the gap G around the front end of an electrode finger 27, an electric field E2 in the D2-axis direction is formed. Here, the orientation of the second-order distortion signal (distortion current) is determined by the crystal orientation and does not depend on the orientation of the electric field. Therefore, at the gap G, distortion signals I2 having equal magnitudes and having the same orientation are generated. When viewed from each comb-shaped electrode 23, all gaps G are positioned on one side of the D2-axis direction. Therefore, on the other side of the D2-axis direction, a distortion signal cancelling the distortion signal I2 is not generated. Accordingly, this distortion signal I2 ends up appearing in the output of the IDT electrode 19.

Note that, the second-order distortion signal was mentioned as the example. However, an even order distortion signal, in the same way as the second order distortion signal, is determined not according to the orientation of the electric field, but according to the crystal orientation. Further, the even order distortion signal which was generated in the gap G is not cancelled, but appears at the output of the IDT electrode 19. Further, the distortion signal caused by electrical nonlinearity was explained, and this is true also for a distortion signal caused by mechanical nonlinearity.

Further, though it is clear according to the mechanism explained above, the orientation of the distortion signal does not depend on the orientation of the high frequency signal either.

(Configuration for Reduction of Distortion Signal)

Returning to FIG. 2, the multiplexer 1 has a configuration for reducing even order distortion signals (below, sometimes the "even number order" will be omitted) described above. Specifically, this is for example as follows.

The transmission filter 5 is comprised of one piezoelectric substrate 17 on which IDT electrodes 19 and reflectors 21 forming a plurality of serial resonators 13A and a plurality of parallel resonators 13B are provided. Further, the reception filter 9 is comprised of one piezoelectric substrate 17, separate from the piezoelectric substrate 17 for the transmission filter 5, on which IDT electrodes 19 and reflectors 21 forming the auxiliary resonator 13C and multiple mode type filter 15 are provided.

The piezoelectric substrate 17 for the transmission filter 5 and the piezoelectric substrate 17 for the reception filter 9 are for example formed by single crystals of same material. Note that, the "same material" referred to here is from the viewpoint of the distortion signal. For example, this means that the compositions and structures (crystal structures etc.) are the same. However, there may be a little difference such as difference of impurities which are unintentionally mixed in during the manufacturing process. Further, the piezoelectric substrate 17 for the transmission filter 5 and the piezoelectric substrate 17 for the reception filter 9 are for example cut out at the same cutting angle.

Further, as understood from the orientation of the D2 axis shown in FIG. 2, between the transmission filter 5 and the reception filter 9, the crystal orientations of the piezoelectric substrates 17 are made inverse to each other in the connection with the antenna side wiring 31 (connection with the antenna terminal 7) connecting them to each other.

For example, in the transmission filter 5, in all serial resonators 13A, the positive-side comb-shaped electrodes 23A positioned on the positive side of the D2 axis are electrically connected to the antenna terminal 7 directly or indirectly, and the negative-side comb-shaped electrodes 23B positioned on the negative side of the D2 axis are electrically connected to the transmission terminal 3 directly or indirectly. Further, in all parallel resonators 13B, the positive-side comb-shaped electrodes 23A are electrically connected to the antenna terminal 7 directly or indirectly, and the negative-side comb-shaped electrodes 23B are electrically connected to the reference potential parts directly or indirectly.

On the other hand, for example, in the reception filter, in the auxiliary resonator 13C, the negative-side comb-shaped electrode 23B is electrically connected to the antenna terminal 7 directly or indirectly, and the positive-side comb-shaped electrode 23A is electrically connected to the multiple mode type filter 15 indirectly. Further, among the IDT electrodes 19 in the multiple mode type filter 15, in the IDT electrode 19 which is connected through the auxiliary resonator 13C to the antenna terminal 7, the negative-side comb-shaped electrode 23B is electrically connected to the antenna terminal 7, and the positive-side comb-shaped electrode 23A is electrically connected to the reference potential part.

That is, between the transmission filter 5 and the reception filter 9, the positive-side comb-shaped electrode 23A in one filter (transmission filter 5 in FIG. 2) and the negative-side comb-shaped electrode 23B in the other filter (reception filter 9 in FIG. 2) are connected to each other by the antenna side wiring 31.

Here, as already explained, the orientation of the even order distortion signal relative to the piezoelectric substrate 17 is determined according to the crystal orientation of the piezoelectric substrate 17 and does not depend on the orientation of the electric field. Accordingly, when assuming that the same signal is input to the transmission filter 5 and the reception filter 9 and paying attention to a certain point in time, regardless of the input route, in both the two filters, a distortion signal traveling from the positive-side comb-shaped electrode 23A to the negative-side comb-shaped electrode 23B (or a distortion signal in the inverse direction to that) is generated.

Accordingly, when viewed from the antenna side wiring 31, a distortion signal which travels from the positive-side comb-shaped electrode 23A to the negative-side comb-shaped electrode 23B in the transmission filter 5 is output from the antenna side wiring 31 to the transmission filter 5, while the distortion signal which travels from the positive-side comb-shaped electrode 23A to the negative-side comb-shaped electrode 23B in the reception filter 9 is input from the reception filter 9 to the antenna side wiring 31. That is, signals having inverse phases to each other are input from the transmission filter 5 and the reception filter 9 to the antenna side wiring 31 and are cancelled by each other. In this way, the distortion signals are reduced. In other words, in the transmission filter 5 and the reception filter 9 which are connected in parallel relative to the antenna terminal 7, the distortion signals are cancelled by each other.

Note that, as the signals which are (almost) simultaneously input to both of the transmission filter 5 and the reception filter 9 and become the cause of the distortion signals in the two filters, for example, there can be mentioned signals which are input to the antenna terminal 7 and are input in parallel to the transmission filter 5 and reception filter 9. As these signals which are input in parallel, for example, there can be mentioned the reception signal RS shown in FIG. 1 and interference signal (noise) received at the antenna 109. Further, as another example, there can be mentioned a signal which passes through one of the transmission filter 5 and the reception filter 9 and is input to the other. As the signal which passes through one and is input to the other in this way, for example, there can be mentioned the transmission signal TS shown in FIG. 1. This is because, the transmission signal TS is input to the transmission terminal 3 and passes through the transmission filter 5, then is input to not only the antenna terminal 7, but also the reception filter 9. The multiplexer 1 in the present embodiment can reduce the distortion signals caused by various types of signals described above.

In particular, the problem in the multiplexer 1 is the phenomenon that, due to the transmission signal TS having a relatively high strength in the multiplexer 1 and the interference signal from the antenna terminal 7, a distortion signal having a relatively high strength which has a frequency obtained by adding the frequencies of the two signals to each other is generated and that frequency is contained in the passband of the reception signal. The multiplexer 1 in the present embodiment can reduce such a phenomenon.

As described above, in the present embodiment, the communication module 101 has the first acoustic wave elements (for example, serial resonators 13A) and the second acoustic wave element (for example auxiliary resonator 13C) which is connected to the first acoustic wave elements. Each of the resonators 13 has the piezoelectric substrate 17 and a positive-side comb-shaped electrode 23A and negative-side comb-shaped electrode 23B which are positioned on the piezoelectric substrate 17 and mesh with each other. The positive-side comb-shaped electrode 23A in the transmission filter 5 and the negative-side comb-shaped electrode 23B in the reception filter 9 are connected to each other, and the orientation from the positive-side comb-shaped electrode 23A to the negative-side comb-shaped electrode 23B relative to the crystal orientation of the piezoelectric substrate 17 in the transmission filter 5 and the orientation from the negative-side comb-shaped electrode 23B to the positive-side comb-shaped electrode 23A relative to the crystal orientation of the piezoelectric substrate 17 in the reception filter 9 are inverse to each other.

This will be explained by another expression by defining the orientation from the first comb-shaped electrode to the second comb-shaped electrode in a first acoustic wave element as the first direction and defining the orientation from the third comb-shaped electrode to the fourth comb-shaped electrode in the second acoustic wave element as the second direction. Each of these first direction and second direction has the Z-axis component of the crystal orientation of the piezoelectric substrate. Specifically, it has the projection component parallel to the upper surface when projecting the Z-axis onto the upper surface of the piezoelectric substrate 17. This projection component is parallel to the D2-axis direction. Further, in the example explained above, the forward direction (from negative side to positive side) of the D2 direction and the forward direction (from negative side to positive side) of the projection component of the Z-axis are inverse.

Note that, the "first direction" means the direction from the bus bar 25 in the first comb-shaped electrode to the bus bar 25 in the second comb-shaped electrode. In the same way, the second direction means the direction from the bus bar 25 in the third comb-shaped electrode to the bus bar 25 in the fourth comb-shaped electrode.

Further, the polarities of the Z-axis projection component of the first direction and the Z-axis projection component of the second direction are made different from each other.

In this example, the first comb-shaped electrode in a first acoustic wave element is the positive-side comb-shaped electrode 23A, and the second comb-shaped electrode is the negative-side comb-shaped electrode 23B. From this, the first direction is the −D2 direction (from positive to negative side), and the Z-axis projection component is the forward direction (from negative to positive side). In the same way, the third comb-shaped electrode in the second acoustic wave element is the negative-side comb-shaped electrode 23B, and the fourth comb-shaped electrode is the positive-side comb-shaped electrode 23A. From this, the second direction is the +D2 direction (from negative to positive side), and the Z-axis projection component is the negative direction (from positive to negative side).

In this way, between the first direction and the second direction, the polarities of the projection components of the Z-axis are different. From this, the orientation of the distortion signal generated in a first acoustic wave element and the orientation of the distortion signal generated in the second acoustic wave element are cancelled by each other. Note that, between the first direction and the second direction, the projection components of the Z-axis only have to be different in signs and need not be perfectly inverse directions (ones which are different by 180°). However, if they are made inverse directions in this way, the distortion signal generated in a first acoustic wave element and the distortion signal generated in the second acoustic wave element can be efficiently cancelled by each other.

Accordingly, as explained above, in the module, distortion signals can be cancelled by each other between electronic components (chips) having piezoelectric substrates 17 separated from each other. Further, on the piezoelectric substrate 17, a special configuration for reducing the distortion signal is unnecessary, therefore the module can be simplified. Further, an increase of area due to the division of the resonator does not occur, therefore the module can be reduced in size.

Note that, in the above embodiment, the communication module 101 or multiplexer 1 is an example of the acoustic wave module. Each of the resonators 13 in the transmission filter 5 is an example of the first acoustic wave element, and its positive-side comb-shaped electrode 23A is an example of the first comb-shaped electrode and its negative-side comb-shaped electrode 23B is an example of the second comb-shaped electrode. The auxiliary resonator 13C in the reception filter 9 is an example of the second acoustic wave element, and its negative-side comb-shaped electrode 23B is an example of the third comb-shaped electrode and its positive-side comb-shaped electrode 23A is an example of the fourth comb-shaped electrode. Further, the multiple mode type filter 15 is an example of the second acoustic wave element. In the IDT electrode 19 at the center thereof, the negative-side comb-shaped electrode 23B is an example of the third comb-shaped electrode, and the positive-side comb-shaped electrode 23A is an example of the fourth comb-shaped electrode.

Further, in individual resonators 13 in the transmission filter 5, the negative-side comb-shaped electrode 23B in one of the mutually connected resonators is electrically connected to the positive-side comb-shaped electrode 23A of the other resonator. This is true also for the electrical connection relationships of the auxiliary resonator 13C and multiple mode type filter 15 in the reception filter 9.

Further, in order to make the arrangement direction of a comb-shaped electrode relative to the crystal orientation of the piezoelectric substrate different between the first acoustic wave element and the second acoustic wave element, the cutting angle and use of the front/back faces of the piezoelectric substrate may be made different between the first piezoelectric substrate for the first acoustic wave element and the second piezoelectric substrate for the second acoustic wave element, or this may be realized by using piezoelectric substrates having the same cutting angle and using the same surface but making the arrangement directions of the comb-shaped electrodes different. Further, this may be realized by using piezoelectric substrates having the same cutting angle and using the same surface but rotating the orientation of one relative to the other.

<Second Embodiment>

Figure 5A:
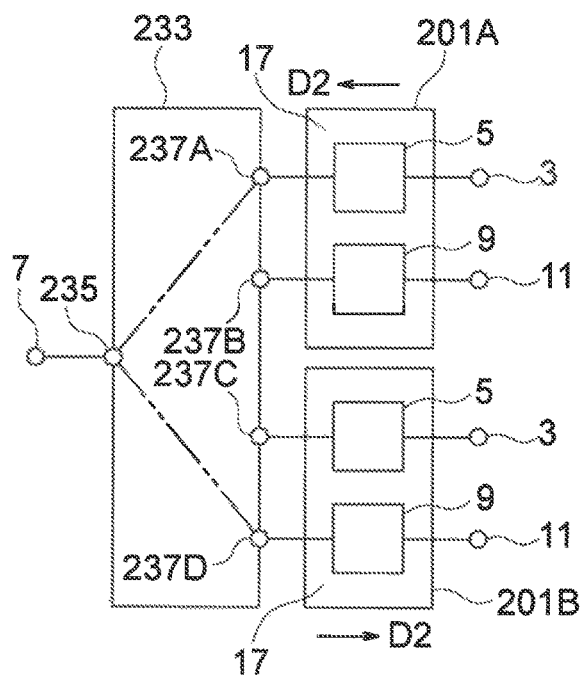
FIG. 5A is a schematic view showing the configuration of a principal part of a multiplex module according to a second embodiment.

FIG. 5A is a schematic view showing the configuration of a principal part of a multiplex module 200 according to a second embodiment of the present invention.

The multiplex module 200 is for dealing with so-called CA (carrier aggregation) and is configured so that it can simultaneously utilize a plurality of (two in the present embodiment) frequency bands. Specifically, for example, this is as follows.

The multiplex module 200 has a switch element 233 which is connected to the antenna terminal 7 and a first multiplexer 201A and second multiplexer 201B (below, sometimes the two will not be differentiated and will be simply referred to as the "multiplexers 201") which are connected to the switch element 233. On the opposite side to the switch element 233 in each multiplexer 201, the transmission terminal 3 and reception terminal 11 are connected.

The switch element 233 is for example configured by an FET (field effect transistor) or another electronic switch. The switch element 233 for example has an antenna-use port 235 which is connected to the antenna terminal 7 and first filter-use port 237A to fourth filter-use port 237D (below, sometimes they will be referred to as the "filter-use ports 237" and they will not be differentiated) which are connected to the multiplexers 201.

The switch element 233 can selectively connect the antenna-use port 235 and a plurality of filter-use ports 237. The switch element 233 may be able to connect only one of the plurality of filter-use ports 237 to the antenna-use port 235, or may be able to simultaneously connect two or more of the former to the later, or may be able to change the number of the ports which can be simultaneously connected. In the present embodiment, the explanation is given assuming that the switch element 233 can simultaneously connect at least either of the first filter-use port 237A and second filter-use port 237B and at least either of the third filter-use port 237C and fourth filter-use port 237D to the antenna-use port 235. FIG. 5A exemplifies a case where the first filter-use port 237A and the fourth filter-use port 237D are simultaneously connected to the antenna-use port 235 by imaginary lines (two dotted-chain lines).

The multiplexers 201 are the same as the multiplexer 1 in the first embodiment. However, in the present embodiment, in each multiplexer 201, the transmission filter 5 and the reception filter 9 are provided on a common piezoelectric substrate 17. Note that, in FIG. 5A, one reception terminal 11 is connected with respect to each reception filter 9. This is just because FIG. 5A is a more schematic view than FIG. 2. That is, the number of the reception terminals 11 may be one corresponding to the unbalanced signal or may be two corresponding to the balanced signals. This is true also in the other embodiments which will be explained later.

Each of the switch element 233 and two multiplexers 201 is configured in a chip state, and they are mounted on a not shown circuit board to be connected to each other through wirings of the circuit board. Note that, the range of configuration as the chip is not limited to this. For example, the circuit board on which the switch element 233 and two multiplexers 201 are mounted may be further configured as a chip or two multiplexers 201 may be configured as one chip and mounted on the circuit board.

Figure 5B:
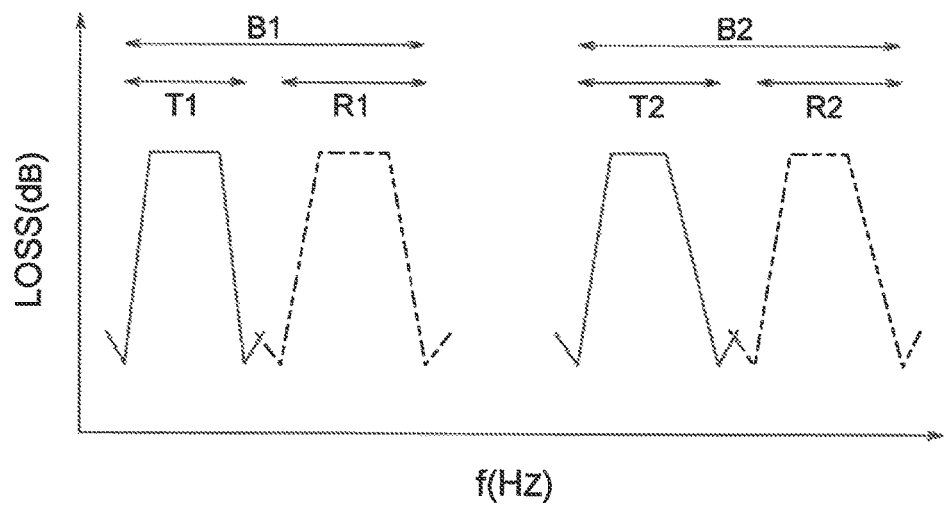
FIG. 5B is a schematic view showing a passband of the multiplex module in FIG. 5A.

FIG. 5B is a schematic view showing frequency bands of signals output by the multiplex module 200. An abscissa shows frequencies "f" (Hz), and an ordinate shows attenuation amounts (dB, upper side of the drawing sheet is 0).

The first frequency band B1 indicates the frequency band of the signal output by the first multiplexer 201A, and the second frequency band B2 indicates the frequency band of the signal output by the second multiplexer 201B. The second frequency band B2 is higher than the first frequency band B1, and the two frequency bands do not overlap each other.

Further, in the first frequency band B1, the first transmission frequency band T1 indicates the passband of the transmission filter 5 in the first multiplexer 201A, and the first reception frequency band R1 indicates the passband of the reception filter 9 in the first multiplexer 201A. By the first reception frequency band R1 being higher than the first transmission frequency band T1 (vice versa), the two frequency bands do not overlap each other.

In the same way, in the second frequency band B2, the second transmission frequency band T2 indicates the passband of the transmission filter 5 in the second multiplexer 201B, and the second reception frequency band R2 indicates the passband of the reception filter 9 in the second multiplexer 201B. By the second reception frequency band R2 being higher than the second transmission frequency band T2 (vice versa), the two frequency bands do not overlap each other.

As indicated by the orientations of the D2-axis in FIG. 5A, between the first multiplexer 201A and the second multiplexer 201B, concerning the connection with respect to the switch element 233 (antenna terminal 7), the crystal orientations of the piezoelectric substrates 17 are made inverse. That is, in the first multiplexer 201A, the positive-side comb-shaped electrode 23A is connected to the switch element 233, and in the second multiplexer 201B, the negative-side comb-shaped electrode 23B is connected to the switch element 233 (vice versa). Accordingly, in the same way as the first embodiment, the distortion signals generated in the gaps G (FIG. 3 and FIG. 4) are cancelled by each other between the acoustic wave elements (resonators 13 etc.), therefore the distortion signals can be reduced. In other words, the first multiplexer 201A and the second multiplexer 201B are connected in parallel through the antenna terminal 7. For this reason, the distortion signals can be cancelled by each other between ones connected in parallel to each other.

For example, as shown in FIG. 5A, when the transmission filter 5 in the first multiplexer 201A and the reception filter 9 in the second multiplexer 201B are simultaneously connected to the antenna terminal 7, in the two filters, the transmission signal from the transmission terminal 3 connected to the first multiplexer 201A and the interference signal from the antenna terminal 7 are input, therefore distortion signals caused by the two signals are generated. These distortion signals will be output from the two filters in phases inverse to each other to the switch element 233 side and will be cancelled by each other. Due to this, for example, the attenuation characteristic between the first frequency band B1 and the second frequency band B2 is improved, and consequently the SN ratio can be improved.

Further, when the transmission filter 5 in the first multiplexer 201A and the transmission filter 5 in the second multiplexer 201B are simultaneously connected, distortion signals which are generated by the individual transmission signals having a plurality of frequencies are generated in a direction canceling each other, therefore the distortion signals in the entire acoustic wave module 200 can be reduced.

Note that, in the present embodiment, the multiplex module 200 is an example of the acoustic wave module. The resonators 13 (FIG. 2) in the transmission filter 5 in the first multiplexer 201A are examples of the first acoustic wave element, the positive-side comb-shaped electrodes 23A (FIG. 2) thereof are examples of the first comb-shaped electrode, and the negative-side comb-shaped electrodes 23B (FIG. 2) are examples of the second comb-shaped electrode. The auxiliary resonator 13C (FIG. 2) of the reception filter 9 in the second multiplexer 201B is an example of the second acoustic wave element, the negative-side comb-shaped electrode 23B (FIG. 2) thereof is an example of the third comb-shaped electrode, and the positive-side comb-shaped electrode 23A (FIG. 2) is an example of the fourth comb-shaped electrode.

<Third Embodiment>

Figure 6:
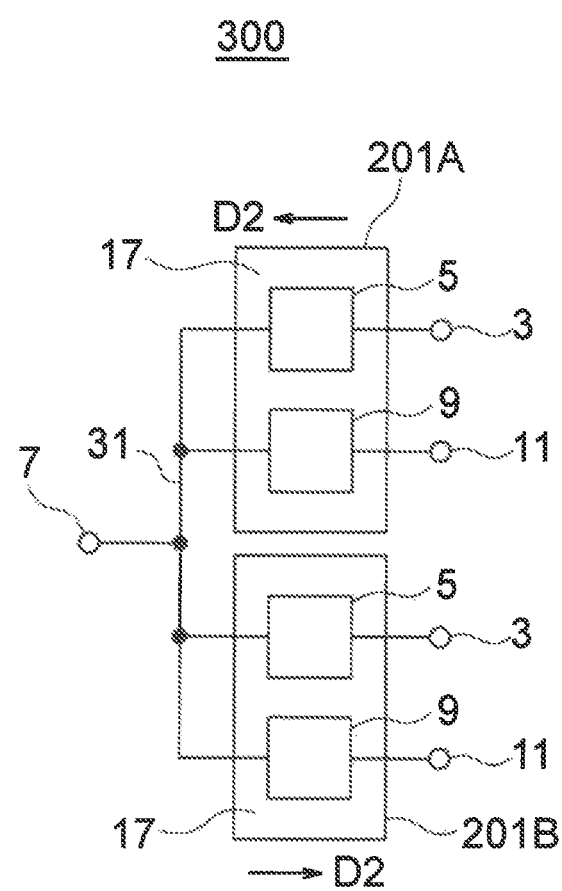
FIG. 6 is a schematic view showing the configuration of a principal part of a multiplex module according to a third embodiment.

FIG. 6 is a schematic view showing the configuration of a principal part of a multiplex module 300 according to a third embodiment of the present invention.

The multiplex module 300, in the same way as the multiplex module 200 in the second embodiment, deals with CA and has a first multiplexer 201A and second multiplexer 201B using frequency bands different from each other as the passbands. In this example as well, the first multiplexer 201A and the second multiplexer 201B are connected in parallel with respect to the antenna terminal 7. Each multiplexer 201 may be configured as one chip, or other matters are the same as the second embodiment.

However, in the present embodiment, unlike the second embodiment, the multiplexers 201 are connected to the antenna terminal 7 without interposition of a switch element. From another viewpoint, the first multiplexer 201A and the second multiplexer 201B are connected to each other by the antenna side wiring 31.

Further, in the present embodiment, in each multiplexer 201, a switch element is not provided between the antenna terminal 7 and the transmission filter 5 and reception filter 9. Accordingly, the four filters in total, i.e., the transmission filter 5 and reception filter 9 in the first multiplexer 201A and the transmission filter 5 and reception filter 9 in the second multiplexer 201B, are connected to each other by the antenna side wiring 31.

In such a configuration as well, as indicated by the orientations of the D2 axis, in the same way as the second embodiment, by making the crystal orientations of the piezoelectric substrates 17 inverse between the first multiplexer 201A and the second multiplexer 201B concerning the connection with respect to the antenna terminal 7, the distortion signals are cancelled by each other between the two multiplexers 201, therefore the distortion signals can be reduced.

Note that, in the second embodiment and third embodiment explained above, the explanation was given by using the example where the same frequency band (first frequency band B1 or second frequency band B2) was used in one multiplexer (201A or 201B), but the art is not limited to this. For example, when the first reception frequency band of the first frequency band B1 and the second transmission frequency band of the second frequency band B2 are close, they may be used in one multiplexer as well. That is, a reception filter and the transmission filter having different frequency bands may be put together in one multiplexer as well.

<Fourth Embodiment>

Figure 7A:
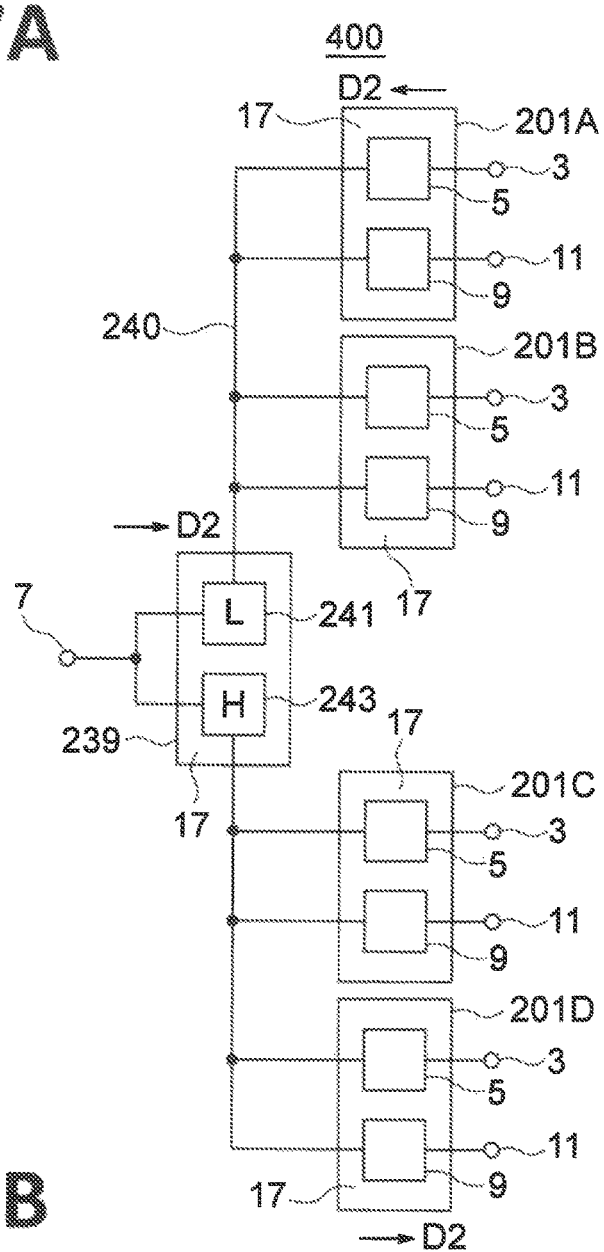
FIG. 7A is a schematic view showing the configuration of a principal part of a multiplex module according to a fourth embodiment.

FIG. 7A is a schematic view showing the configuration of a principal part of a multiplex module 400 according to a fourth embodiment of the present invention.

The multiplex module 400, in the same way as the multiplex modules in the second and third embodiments, deals with CA and has a plurality of (four in FIG. 7) multiplexers 201 (first multiplexer 201A to fourth multiplexer 201D) using frequency bands which are different from each other as the passbands. Each multiplexer 201 may be configured as one chip, or other matters are the same as the second embodiment.

Further, by providing a combination of filters having inverse crystal orientations of piezoelectric substrate 17 among the first multiplexer 201A to the fourth multiplexer 201D which are connected in parallel with respect to the antenna terminal 7, the distortion current can be reduced.

Figure 7B:
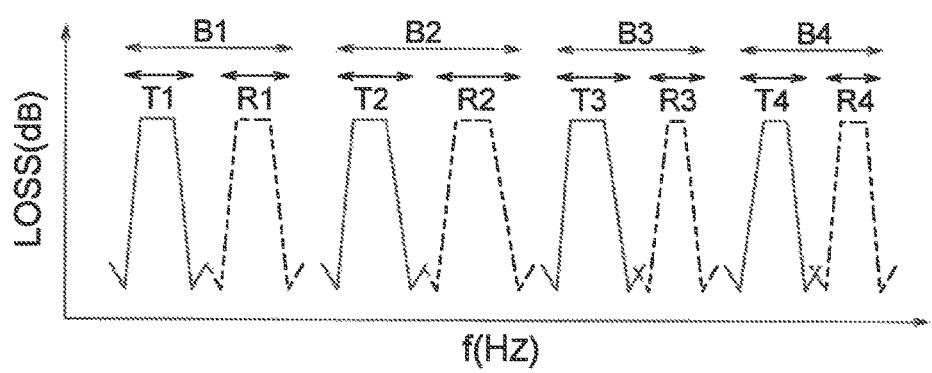
FIG. 7B is a schematic view showing a passband of the multiplex module in FIG. 7A.

FIG. 7B is a schematic view the same as FIG. 5 and shows the passbands of the multiplexers 201. The passbands of the first multiplexer 201A to the fourth multiplexer 201D correspond to the first frequency band B1 to the fourth frequency band B4 and do not overlap each other. For example, the mutual relationships of the four frequency bands are first frequency band B1<second frequency band B2<third frequency band B3<fourth frequency band B4. Note that, in each frequency band, in the same way as the second embodiment, the frequency band for transmission (T1, t2, T3, or T4) and frequency band for reception (R1, R2, R3, or R4) are contained.

In the multiplex module 400, unlike the second and third embodiments, an upper stage multiplexer 239 is provided between the antenna terminal 7 and the plurality of multiplexers 201. The upper stage multiplexer 239 and the multiplexers 201 are connected in series relative to the antenna terminal 7. The upper stage multiplexer 239 for example branches a signal in a frequency band containing the passbands (B1 and B2) of the first multiplexer 201A and second multiplexer 201B and a signal in a frequency band containing the passbands (B3 and B4) of the third multiplexer 201C and fourth multiplexer 201D, outputs the former to the first multiplexer 201A and second multiplexer 201B, and outputs the latter to the third multiplexer 201C and fourth multiplexer 201D.

The concrete configuration thereof may be a suitable one. For example, the upper stage multiplexer 239 may have a low frequency side filter 241 and a high frequency side filter 243 which are connected so as to be parallel to each other relative to the antenna terminal 7.

The low frequency side filter 241 has as its passband a frequency band which contains the passbands of the first multiplexer 201A and second multiplexer 201B, but does not contain the passbands of the third multiplexer 201C and fourth multiplexer 201D. The first multiplexer 201A and second multiplexer 201B are connected through the low frequency side filter 241 to the antenna terminal 7.

The high frequency side filter 243 has as its passband a frequency band which does not contain the passbands of the first multiplexer 201A and second multiplexer 201B, but contains the passbands of the third multiplexer 201C and fourth multiplexer 201D. The third multiplexer 201C and fourth multiplexer 201D are connected through the high frequency side filter 243 to the antenna terminal 7.

The low frequency side filter 241 and high frequency side filter 243 may be suitably configured. For example, each of the filters, in the same way as the transmission filter 5, may be configured by a ladder type filter which is formed by a plurality of 1-port SAW resonators (13: piezoelectric substrate 17, IDT electrode 19, and pair of reflectors 21). Note that, the low frequency side filter 241 and the high frequency side filter 243 may be provided on the same piezoelectric substrate 17 as illustrated or may be provided on different piezoelectric substrates 17.

The upper stage multiplexer 239 and the first multiplexer 201A are connected to each other in series relative to the antenna terminal 7 by intermediate wiring 240, but the directions of the crystal orientations of the piezoelectric substrates 17 of the two multiplexers become inverse as indicated by the orientations of the D2 axis.

Accordingly, in the present embodiment, between the upper stage multiplexer 239 and the first multiplexer 201A, the distortion signals generated in the gaps G are cancelled by each other. Due to this, as a multiplex module 400 as a whole, the distortion signals are reduced. In this way, by making the directions of the crystal orientations of the piezoelectric substrates 17 inverse with respect to the flow of the signals at the two multiplexers which are connected in series relative to the antenna terminal 7, the distortion signals can be cancelled by each other.

Note that, FIG. 7A showed the D2 axis which was directed inverse to the D2 axis of the upper stage multiplexer 239 for only the first multiplexer 201A. However, for the other multiplexers 201 as well, in the same way as the first multiplexer 201A, the crystal orientations of the piezoelectric substrates 17 may also be set so that the distortion signals are cancelled by each other with the upper stage multiplexer 239.

Further, as already explained, the distortion signals may be cancelled by each other among the multiplexers 201 connected parallel to each other as well. At this time, the distortion signals may be cancelled by each other among the multiplexers 201 connected through the upper stage multiplexer 239 parallel to each other as well. FIG. 7A exemplifies a case where the D2 axes become inverse between the first multiplexer 201A and the fourth multiplexer 201D. Note that, the filter (5 or 9) in the first multiplexer 201A and the filter (5 or 9) in the fourth multiplexer 201D are examples of the first filter and second filter.

<Fifth Embodiment>

FIG. 8 is a schematic view showing the configuration of a principal part of a multiplex module 500 according to a fifth embodiment of the present invention.

The multiplex module 500, in the same way as the second embodiment (FIG. 5), is comprised of an antenna terminal 7 and a plurality of (three in FIG. 8) multiplexers 201 (first multiplexer 201A to third multiplexer 201C) between which a switch element 233 is interposed.

Note that, in the example in FIG. 8, in each multiplexer 201, the transmission filter 5 and the reception filter 9 are connected to the same port in the switch element 233. However, in the same way as the second embodiment, the transmission filter 5 and the reception filter 9 may be connected to different ports in the switch element 233 as well (this is true also for FIG. 9 and FIG. 10 as will be explained later). Conversely, in the second embodiment, as in the present embodiment, the two filters in each multiplexer 201 may be connected to each port in the switch element 233 as well.

As indicated by arrows y1 and y2 in FIG. 8, the multiplex module 500 in the present embodiment is configured so that the distortion signal generated in the switch element 233 and the distortion signal generated in at least one of the plurality of multiplexers 201 are cancelled by each other.

Here, the phase of the distortion signal of the switch element 233 cannot be identified from the crystal orientation of the piezoelectric substrate 17 as in the multiplexer 201. However, when considering the multiplexer 201 in which the positive-side comb-shaped electrode 23A connected to the switch element 233 and the multiplexer 201 in which the negative-side comb-shaped electrode 23B connected to the switch element 233, between the two multiplexers 201, when signals having the same phases as each other are input as the signals which cause distortion signals, the phases of the distortion signals which are output to the switch element 233 are inverse to each other. Accordingly, the distortion signal of one of the multiplexers 201 deviates in phase within a range of 90° to 270° from the phase of the distortion signal generated in the switch element 233.

Therefore, for example, two types of multiplexers 201 in which the crystal orientations of the piezoelectric substrates 17 relative to the IDT electrodes 19 and reflectors 21 in the transmission filter 5 and the reception filter 9 etc. are inverse to each other are experimentally produced, and each of the multiplexers 201 and the switch element 233 are connected and tested. Further, among the multiplexers 201, a multiplexer 201 in which the phase of the distortion signal of the former and the phase of the distortion signal of the switch element 233 deviate within a range of 90° to 270° is employed. Due to this, an increase of distortion signals between the switch element 233 and the multiplexer 201 can be avoided. Further, if the deviation of phases exceeds 90°, but is less than 270°, the distortion signals are cancelled by each other to some extent. As a result, the distortion signals can be reduced in the multiplex module 500 as a whole.

Note that, FIG. 8 showed the arrows y1 and y2 etc. for only the first multiplexer 201A. However, for the other multiplexers 201 as well, in the same way as the first multiplexer 201A, the crystal orientations of the piezoelectric substrates 17 may be set so as to cancel the distortion signals with the switch element 233 as well.

<Sixth Embodiment>

Figure 9:
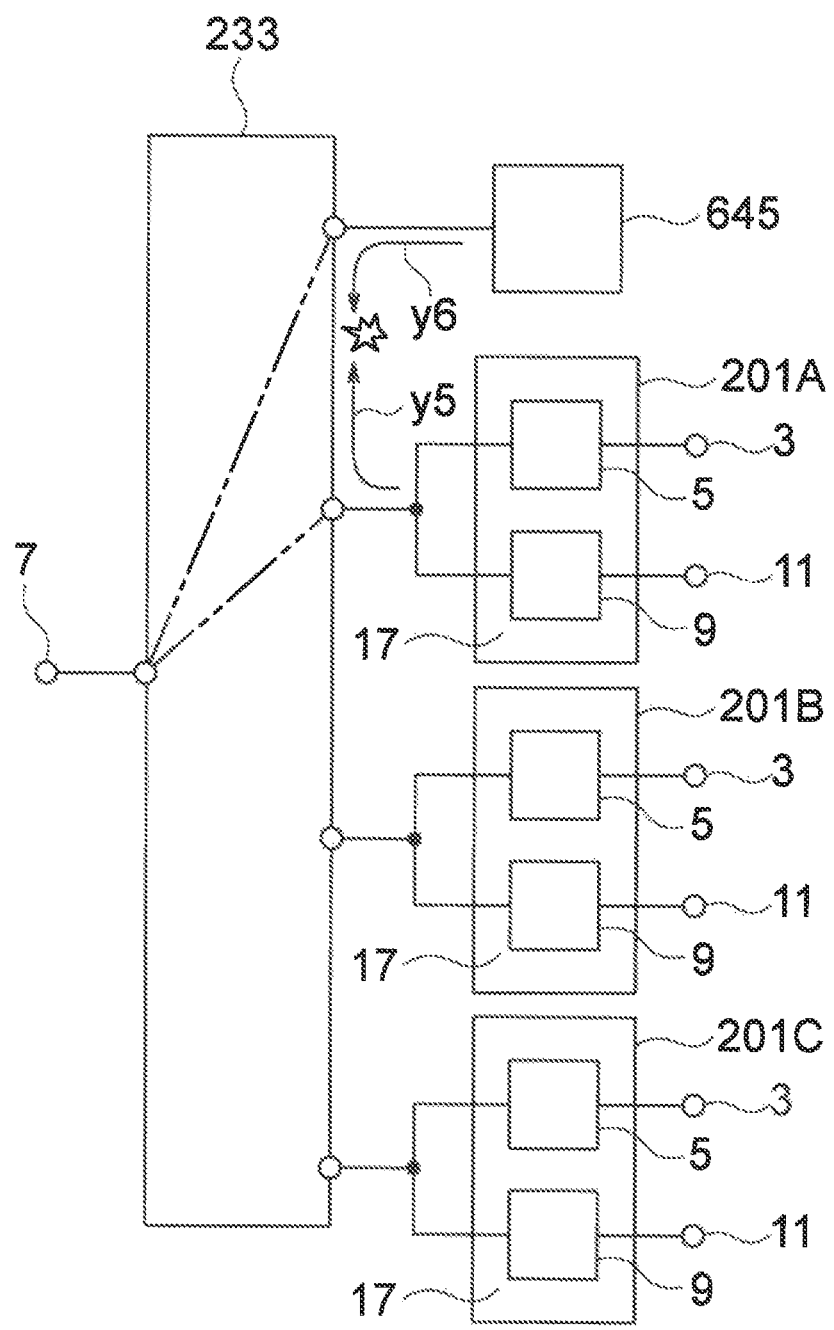
FIG. 9 is a schematic view showing the configuration of a principal part of a multiplex module according to a sixth embodiment.

FIG. 9 is a schematic view showing the configuration of a principal part of a multiplex module 600 according to a sixth embodiment of the present invention.

The fundamental configuration of the multiplex module 600 in the present embodiment is the same as the fifth embodiment (FIG. 8). However, the multiplex module 600, as indicated by arrows y5 and y6, has a distortion reducing element 645 which generates a distortion signal which cancels the distortion signal of the multiplexer 201 and vice versa.

The distortion reducing element 645, for example, is connected to the switch element 233 so as to become parallel to the multiplexers 201. Further, the distortion reducing element 645 is connected to the antenna terminal 7 all the time or according to need and consequently connected through the switch element 233 to the multiplexer 201 which is selectively connected to the antenna terminal 7 among the plurality of multiplexers 201.

The distortion reducing element 645, for example, although not particularly shown, is configured by providing a piezoelectric substrate 17 and a pair of electrodes facing each other in the D2-axis direction with respect to the piezoelectric substrate 17 and generates distortion signals according to the same principle as that for the IDT electrode 19. The pair of electrodes may be parallel plates or may have the same configuration as that of the IDT electrode 19. Further, in the same way as the mutual cancellation of distortion signals between the IDT electrodes 19, concerning the connection with respect to the switch element 233, the electrodes are connected to the switch element 233 so that the crystal orientations of the piezoelectric substrates 17 become inverse.

In this way, the distortion signals may be reduced not by mutually cancelling the distortion signals among the already existing electronic elements, but by adding the distortion reducing element 645 for reducing the distortion signals. However, the distortion reducing element 645 may be used also for another purpose. For example, it may be used for adjusting the capacity of the multiplex module 600.

Note that, the distortion reducing element 645 may be one utilized in common for the plurality of multiplexers 201 or may be one utilized for part (for example one) of the multiplexers 201 among the plurality of multiplexers 201. Further, a plurality of distortion reducing elements 645 may be provided. For example, one may be provided for each multiplexer 201.

<Seventh Embodiment>

Figure 10:
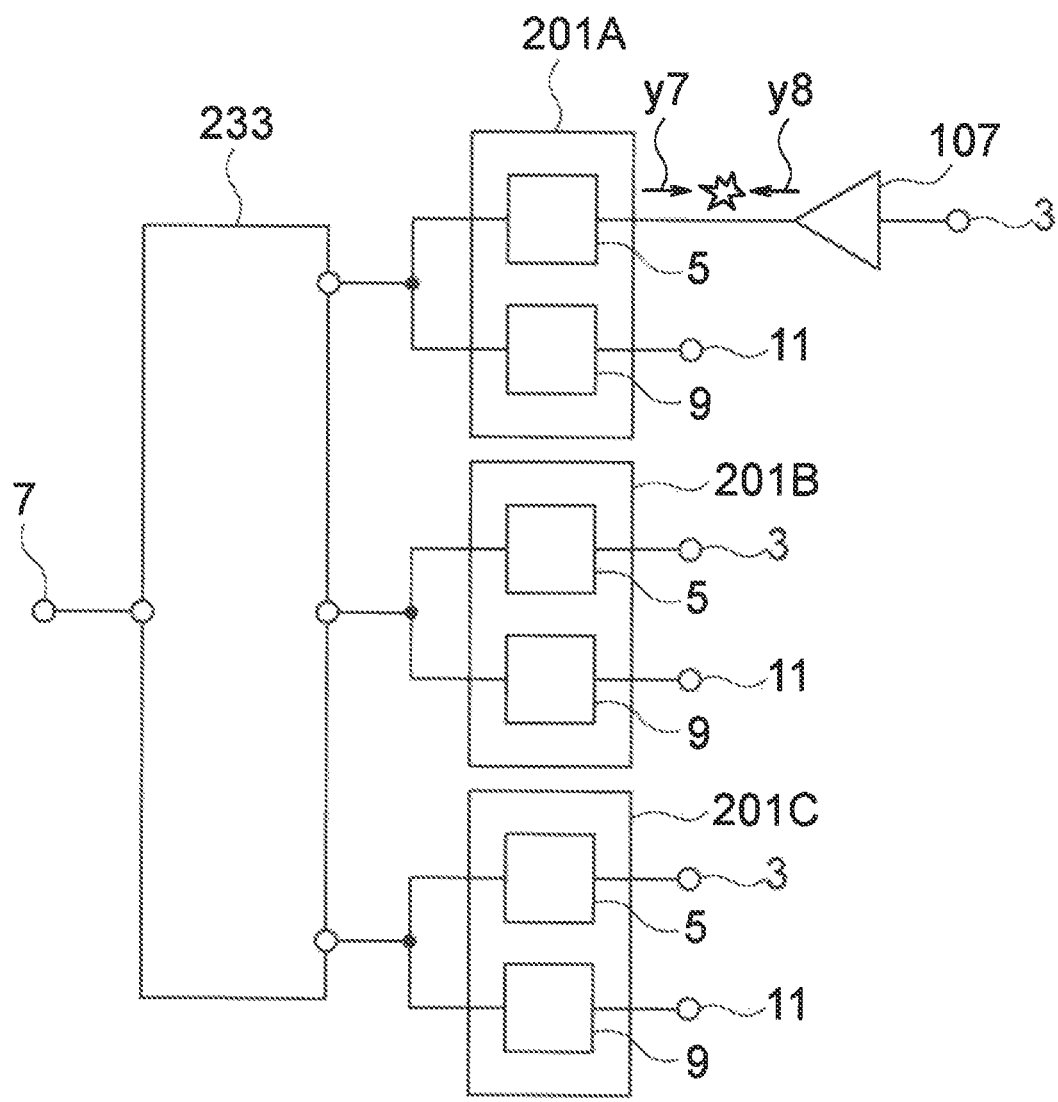
FIG. 10 is a schematic view showing the configuration of a principal part of a multiplex module according to a seventh embodiment.

FIG. 10 is a schematic view showing the configuration of a principal part of a multiplex module 700 according to a seventh embodiment of the present invention.

The fundamental configuration of the multiplex module 700 in the present embodiment is the same as the fifth embodiment (FIG. 8). However, in the multiplex module 700, as indicated by the arrows y7 and y8, the distortion signals are cancelled by each other between the multiplexer 201 and the amplifier 107 (see FIG. 1 too).

The principle thereof is the same as the fifth embodiment. That is, for the connection with the amplifier 107, in one of the two types of multiplexers 201 (transmission filters 5) in which the crystal orientations of the piezoelectric substrates 17 are inverse to each other, the phase of the distortion signal output to the amplifier 107 side deviates within the range of 90° to 270° relative to the phase of the distortion signal which is output by the amplifier 107 to the multiplexer 201 side, therefore that one multiplexer 201 is employed.

Note that, FIG. 10 shows only one amplifier 107. However, in actuality, the amplifier 107 may be provided for each of the multiplexers 201 (transmission filters 5) or may be provided in common for the plurality of multiplexers 201. When the amplifier 107 is provided in common with respect to the plurality of multiplexers 201, the switch element may be interposed between the multiplexers 201 and the amplifier 107 as well.

The present invention is not limited to the above embodiments and may be executed in various aspects.

For example, the first to seventh embodiments may be suitably combined as well. Specifically, for example, even in a mode where the distortion signals are cancelled by each other among the plurality of multiplexers or between the multiplexer and the electronic element other than the multiplexer as in the second to seventh embodiments, like in the first embodiment, the transmission filter and the reception filter may be provided on different piezoelectric substrates and mutual cancellation of the distortion signals between the two filters may be enabled. Further, for example, as in the fourth to seventh embodiments, even in a mode where the distortion signals are cancelled by each other between the multiplexer and the electronic element which is connected in series to that multiplexer or between the multiplexer and the distortion reducing element, like in the second and third embodiments, mutual cancellation of the distortion signals among the parallel-connected multiplexers may be enabled as well.

As understood from the first to seventh embodiments, the electronic elements mutually cancelling the distortion signals may be suitably selected so far as one includes an acoustic wave element and the other generates an even order distortion signal. That is, in the electronic elements mutually cancelling the distortion signals, the type thereof (for example multiplexer, switch element, or amplifier), number, and connection method (serial or parallel etc. concerning the route of the signals which become the cause of the distortion signals) are not limited.

In the first to third embodiments (FIG. 1 to FIG. 6), an explanation was given on the case where the distortion signals were reduced between two piezoelectric substrates.

From another viewpoint, they were configured so that the distortion signals were cancelled by each other in all piezoelectric substrates. However, for example, the crystal orientation of the piezoelectric substrate may be made inverse concerning the connection with the antenna terminal in only one of the plurality of piezoelectric substrates connected parallel with respect to the antenna terminal. In this way, even if the number of the acoustic wave elements in which the crystal orientation of the piezoelectric substrate is set so as to cancel the distortion signals is one, the distortion signals are reduced compared with the case where the crystal orientations of all piezoelectric substrates are made the same.

Further, in the embodiments explained above, an explanation was given on the case where the first piezoelectric substrate and the second piezoelectric substrate were formed by the same material, but there is a mutual cancellation effect of the distortion signals even in the case of different materials.

REFERENCE SIGNS LIST

1 . . . multiplexer (acoustic wave module), 13A . . . serial resonator (first acoustic wave element), 13C . . . auxiliary resonator (second acoustic wave element), 17 . . . piezoelectric substrate, 23A . . . positive-side comb-shaped electrode (first or forth comb-shaped electrode), 23B . . . negative-side comb-shaped electrode (second or third combed-shaped electrode), 101 . . . communication module (acoustic wave module).

The invention claimed is:

1. An acoustic wave module comprising:
a first acoustic wave element and
a second acoustic wave element which is electrically connected to the first acoustic wave element, wherein
the first acoustic wave element comprises
a first piezoelectric substrate formed by a single crystal and
a first comb-shaped electrode and a second comb-shaped electrode which are located on the first piezoelectric substrate and intermesh with each other,
the second acoustic wave element comprises
a second piezoelectric substrate which is formed by a single crystal of the same material as that for the first piezoelectric substrate, but is separate from the first piezoelectric substrate and
a third comb-shaped electrode and a fourth comb-shaped electrode which are located on the second piezoelectric substrate and intermesh with each other,
the first comb-shaped electrode and the third comb-shaped electrode are electrically connected, and
a direction from the first comb-shaped electrode to the second comb-shaped electrode relative to a direction obtained by projecting a Z-axis component of a crystal of the first piezoelectric substrate onto a surface of the first piezoelectric substrate and a direction from the third comb-shaped electrode to the fourth comb-shaped electrode relative to a direction obtained by projecting a Z-axis of a crystal of the second piezoelectric substrate onto a surface of the second piezoelectric substrate are in opposite directions;
the acoustic wave module comprises
an antenna terminal,
a switch element connected to the antenna terminal, and
a first multiplexer and second multiplexer which are connected to the switch element, wherein
the first multiplexer comprises
a first transmission filter a passband of which is a predetermined first transmission frequency band and
a first reception filter a passband of which is a first reception frequency band outside of the first transmission frequency band,
the second multiplexer comprises
a second transmission filter a passband of which is a second transmission frequency band which is higher than the first transmission frequency band and the first reception frequency band and
a second reception filter a passband of which is a second reception frequency band which is higher than the first transmission frequency band and the first reception frequency band and is out of the second transmission frequency band,
the switch element can simultaneously connect either of the first transmission filter and the first reception filter and either of the second transmission filter and the second reception filter to the antenna terminal, and
one of two filters which are simultaneously connected to the antenna terminal by the switch element comprises the first acoustic wave element in which the first comb-shaped electrode is connected to the switch element, and the other comprises the second acoustic wave element in which the third comb-shaped electrode is connected to the switch element.

2. The acoustic wave module according to claim 1, wherein the direction from the first comb-shaped electrode to the second comb-shaped electrode and the direction from the third comb-shaped electrode to the fourth comb-shaped electrode are in opposite directions.

3. An acoustic wave module comprising:
a first acoustic wave element and
a second acoustic wave element which is electrically connected to the first acoustic wave element, wherein
the first acoustic wave element comprises
a first piezoelectric substrate formed by a single crystal and
a first comb-shaped electrode and a second comb-shaped electrode which are located on the first piezoelectric substrate and intermesh with each other,
the second acoustic wave element comprises
a second piezoelectric substrate which is formed by a single crystal of the same material as that for the first piezoelectric substrate, but is separate from the first piezoelectric substrate and
a third comb-shaped electrode and a fourth comb-shaped electrode which are located on the second piezoelectric substrate and intermesh with each other,
the first comb-shaped electrode and the third comb-shaped electrode are electrically connected, and
a direction from the first comb-shaped electrode to the second comb-shaped electrode relative to a direction obtained by projecting a Z-axis component of a crystal of the first piezoelectric substrate onto a surface of the first piezoelectric substrate and a direction from the third comb-shaped electrode to the fourth comb-shaped electrode relative to a direction obtained by projecting a Z-axis of a crystal of the second piezoelectric substrate onto a surface of the second piezoelectric substrate are in opposite directions;
the acoustic wave module comprises
an antenna terminal,
a multiplexer which is connected to the antenna terminal and branches a signal from the antenna terminal to a signal in a first upper stage frequency band and a signal in a second upper stage frequency band, a first filter which is connected to the multiplexer and a passband of which is a portion of the first upper stage frequency band, and a second filter which is connected to the multiplexer and a passband of which is a portion of the second upper stage frequency band, wherein the first filter comprises the first acoustic wave element in which the first comb-shaped electrode is connected to the multiplexer, and the second filter comprises the second acoustic wave element in which the third comb-shaped electrode is connected to the multiplexer.

4. The acoustic wave module according to claim 3, wherein the direction from the first comb-shaped electrode to the second comb-shaped electrode and the direction from the third comb-shaped electrode to the fourth comb-shaped electrode are in opposite directions.

5. An acoustic wave module comprising:

a first acoustic wave element and a second acoustic wave element which is electrically connected to the first acoustic wave element, wherein the first acoustic wave element comprises a first piezoelectric substrate formed by a single crystal and a first comb-shaped electrode and a second comb-shaped electrode which are located on the first piezoelectric substrate and intermesh with each other, the second acoustic wave element comprises a second piezoelectric substrate which is formed by a single crystal of the same material as that for the first piezoelectric substrate, but is separate from the first piezoelectric substrate and a third comb-shaped electrode and a fourth comb-shaped electrode which are located on the second piezoelectric substrate and intermesh with each other, the first comb-shaped electrode and the third comb-shaped electrode are electrically connected, and a direction from the first comb-shaped electrode to the second comb-shaped electrode relative to a direction obtained by projecting a Z-axis component of a crystal of the first piezoelectric substrate onto a surface of the first piezoelectric substrate and a direction from the third comb-shaped electrode to the fourth comb-shaped electrode relative to a direction obtained by projecting a Z-axis of a crystal of the second piezoelectric substrate onto a surface of the second piezoelectric substrate are in opposite directions;

the acoustic wave module comprises an antenna terminal, a first multiplexer which is connected to the antenna terminal without going through a switch element, and a second multiplexer which is connected to the antenna terminal without going through a switch element so as to become parallel to the first multiplexer, wherein the first multiplexer comprises a first transmission filter a passband of which is a predetermined first transmission frequency band, and a first reception filter a passband of which is a first reception frequency band outside of the first transmission frequency band, the second multiplexer comprises a second transmission filter a passband of which is a second transmission frequency band which is higher than the first transmission frequency band and the first reception frequency band and a second reception filter a passband of which is a second reception frequency band which is higher than the first transmission frequency band and the first reception frequency band and is out of the second transmission frequency band, either of the first transmission filter and the first reception filter comprises the first acoustic wave element in which the first comb-shaped electrode is connected to the antenna terminal, and either of the second transmission filter and the second reception filter comprises the second acoustic wave element in which the third comb-shaped electrode is connected to the antenna terminal.

6. The acoustic wave module according to claim 5, wherein the direction from the first comb-shaped electrode to the second comb-shaped electrode and the direction from the third comb-shaped electrode to the fourth comb-shaped electrode are in opposite directions.

7. An acoustic wave module comprising:

an acoustic wave element and an electronic component which is electrically connected to the acoustic wave element, wherein the acoustic wave element comprises a first piezoelectric substrate formed by a single crystal and a first comb-shaped electrode and a second comb-shaped electrode which are located on the first piezoelectric substrate and intermesh with each other, and a direction from the first comb-shaped electrode to the second comb-shaped electrode relative to an orthogonal coordinate system XYZ of crystal of the piezoelectric substrate is a direction by which a phase of an even order distortion signal traveling from the acoustic wave element toward the electronic component and a phase of an even order distortion signal traveling from the electronic component toward the acoustic wave element deviate from each other with a difference of 90° to 270°;

the acoustic wave module comprises an antenna terminal, a switch element which comprises an antenna-use port connected to the antenna terminal and a plurality of filter-use ports and can selectively connect the plurality of filter-use ports to the antenna-use port, and a filter which is connected to a first port among the plurality of filter-use ports, wherein the switch element is the electronic component, and the filter comprises the acoustic wave element.

* * * * *